(12) United States Patent  
Miyazaki et al.

(10) Patent No.: US 8,022,743 B2
(45) Date of Patent: Sep. 20, 2011

(54) PULSE WIDTH MODULATION CIRCUIT AND LIQUID JET PRINTING APPARATUS

(75) Inventors: Shinichi Miyazaki, Suwa (JP); Hiroyuki Yoshino, Matsumoto (JP); Nobuaki Azami, Matsumoto (JP); Atsushi Oshima, Shiojiri (JP); Noritaka Ide, Shiojiri (JP); Kunio Tabata, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/582,766

(22) Filed: Oct. 21, 2009

(65) Prior Publication Data

US 2010/0097114 A1    Apr. 22, 2010

(30) Foreign Application Priority Data

Oct. 22, 2008 (JP) ................................ 2008-271962

(51) Int. Cl.
*H03K 3/017* (2006.01)
(52) U.S. Cl. ....................................... 327/176; 327/172
(58) Field of Classification Search ........................ None
See application file for complete search history.

(56) References Cited

U.S. PATENT DOCUMENTS

| | | | | |
|---|---|---|---|---|
| 4,591,736 A * | 5/1986 | Hirao et al. | ..................... | 327/91 |
| 6,173,426 B1 * | 1/2001 | Sanada | ......................... | 714/724 |
| 6,801,028 B2 * | 10/2004 | Kernahan et al. | ............. | 323/283 |
| 6,828,837 B2 * | 12/2004 | Ahn | ................................ | 327/202 |
| 7,684,216 B2 * | 3/2010 | Choi et al. | ................. | 363/21.16 |
| 7,746,127 B2 * | 6/2010 | Miyazaki et al. | ............. | 327/112 |
| 2008/0100652 A1 * | 5/2008 | Oshima et al. | ................. | 347/10 |

FOREIGN PATENT DOCUMENTS

| | | |
|---|---|---|
| JP | 04-159821 | 6/1992 |
| JP | 2004-312442 | 11/2004 |
| JP | 2005-329710 | 12/2005 |

* cited by examiner

*Primary Examiner* — Cassandra Cox
(74) *Attorney, Agent, or Firm* — Maschoff Gilmore & Israelsen

(57) ABSTRACT

A pulse width modulation circuit includes: a reference signal generator which generates a plurality of mutually differing reference signals; a comparator which compares the reference signals and an input signal with respect to magnitude, and outputs results of the comparison as a plurality of comparison signals with mutually differing phases; and a synthesizer which, using a logical operation, outputs the plurality of comparison signals output from the comparator as a pulse width modulated signal configured of one or more binary signals.

9 Claims, 12 Drawing Sheets

PULSE WIDTH MODULATION CIRCUIT AND LIQUID JET PRINTING APPARATUS

This application claims priority to Japanese Patent Application No. 2008-271962 filed on Oct. 22, 2008, and the entire disclosure thereof is incorporated herein by reference.

BACKGROUND

1. Technical Field

The present invention relates to a pulse width modulation circuit which modulates an input signal, and outputs a binary, pulse width modulated signal.

2. Related Art

A pulse width modulation circuit which modulates a pulse of an input signal, and outputs a binary, pulse width modulated signal, is widely used to digitally control a voltage. With the pulse width modulation circuit, reference signals with a sawtooth wave, triangle wave, or the like responding to clock signals are generated, the reference signal and the input signal are compared with respect to magnitude, and a binary voltage signal which is at a high level when the input signal is larger than the reference signals, and at a low level when the input signal is smaller than the reference signals, is output as a pulse width modulated signal.

In this kind of pulse width modulation circuit, in order to make the pulse width modulated signal of a high resolution, it is the simplest to heighten the frequency of the clock signals which are the source of the reference signals. However, in the event of heightening the frequency of the clock signals which are the source, a calculation of a comparison between the reference signals and input signal cannot keep pace, making an internal calculation process unstable. That is, there is a limit on a balance between a high resolution and a high speed response.

Therefore, with a pulse width modulation circuit described in JP-A-4-159821, a configuration is such that, by adding or subtracting pulse width modulated signals of a plurality of pulse width modulators, a multivalued signal is generated in a voltage axis direction, and filtered by a smoothing circuit, obtaining an analog signal. Also, with a pulse width modulation circuit described in JP-A-2004-312442, a configuration is such that a plurality of sawtooth waves with differing phases are generated, the sawtooth waves and an input signal are compared and, by synthesizing outputs of results of the comparison via a resistor, a multivalued signal is generated in a voltage axis direction, and filtered by an integration circuit, obtaining an analog signal. That is, with these pulse width modulation circuits, it is intended to realize a high resolution by obtaining the multivalued signal in the voltage axis direction.

However, as a resister or switching element which connects or disconnects the outputs at each voltage stage is needed in order to output the multivalued signal in the voltage axis direction as in the pulse width modulation circuits described in JP-A-4-159821 and JP-A-2004-312442, a need occurs to install the resistor or switching element as a part in the event that power is high, as in a case of driving a digital power amplifier, and a circuit size increases by that much, increasing a cost too.

SUMMARY

An advantage of some aspects of the invention is to provide a pulse width modulation circuit which enables a high resolution and a high speed response while suppressing a circuit size.

A pulse width modulation circuit of one aspect of the invention includes a reference signal generation circuit which generates a plurality of mutually differing reference signals; a comparator which compares the reference signals and an input signal with respect to magnitude, and outputs results of the comparison as a plurality of comparison signals with mutually differing phases; and a synthesizer which synthesizes the plurality of comparison signals output from the comparator using a logical operation and outputs a pulse width modulated signal configured of one or more signals.

According to this pulse width modulation circuit, as the output pulse width modulated signal is a binary signal, one resistor or one switching element will suffice. Because of this, it is possible to suppress a circuit size, and also, one or more binary signals are output as the pulse width modulated signal based on a logical operation of the comparison signals with mutually differing phases obtained by comparing the plurality of mutually differing reference signals and the input signal with respect to magnitude, thereby enabling an increase in resolution in a temporal axis direction. Also, by increasing the number of reference signals (the number of phases), the resolution of the pulse width modulated signal is increased with the frequency of the reference signals maintained in a high condition, meaning that a high speed response is also possible.

Also, the reference signal generation circuit includes a plurality of counters, which increase or decrease for each clock signal, and whose increase start or decrease start initial values differ from one another, so as to correspond to a plurality of the clock signals with mutually differing phases, and outputs from the counters are taken to be the plurality of reference signals.

According to this pulse width modulation circuit, it is possible to output a high-resolution pulse width modulated signal, and it is also possible to realize the high speed response. As it is nevertheless not necessary to heighten the frequency of the clock signals which are the source of generating the reference signals, it is possible to cause a stable operation with a simple circuit.

Also, the reference signal generation circuit includes a counter, which increases or decreases for each clock signal so as to correspond to at least one clock signal from among a plurality of the clock signals with mutually differing phases, and an addition and subtraction section, which generates the plurality of reference signals by adding or subtracting a plurality of offset values, which have mutually differing values correlated to the plurality of clock signals with differing phases, to or from an output from the counter, and the comparator is configured in such a way as to compare the reference signals and the input signal with respect to magnitude, and outputs the comparison results in synchronization with the corresponding clock signals.

According to this pulse width modulation circuit, it being possible to further reduce the number of counters in addition to the heretofore described advantages, it is possible to suppress the circuit size.

Also, the counter switches between the increase and decrease in a predetermined cycle.

According to this pulse width modulation circuit, it is possible to obtain triangle wave signals as the reference signals, whereby, in addition to the heretofore described advantages, it is possible to further suppress an output distortion of the pulse width modulated signal.

Also, in the event that a unit d of the increase or decrease of the counter is an integral multiple of a number N of the clock signals with mutually differing phases, and a phase difference of an ith clock signal CLKi with respect to a clock signal CLK1 with an earliest phase is pi degree, an increase start or decrease start initial value offseti corresponding to the ith clock signal CLKi establishes offseti=dxpi/360+a, where a is a constant.

According to this pulse width modulation circuit, in addition to the heretofore described advantages, it is possible to obtain a high-linearity pulse width modulated signal even in the event that a phase difference between the clock signals is not constant.

Also, the synthesizer includes an OR section which outputs a logical sum of the plurality of comparison signals, an AND section which outputs a logical product of the plurality of comparison signals, and a selection section which selects either the logical sum from the OR section or the logical product from the AND section, and outputs it as a pulse width modulated signal.

According to this pulse width modulation circuit, as well as it being possible to output a pulse width modulated signal with a high resolution in the temporal axis direction, it is possible to adjust the duty ratio of the pulse width modulated signal as necessary.

Also, the selection section selects one of the logical sum from the OR section and the logical product from the AND section when the counter increases, and selects the other when the counter decreases, or is reset.

According to this pulse width modulation circuit, in the kind of case in which the waveform of the reference signals is a triangle wave, a synthesis is carried out in such a way that a comparison error included in a comparison result when the reference signals increase and a comparison error included in a comparison result when they decrease are cancelled out, meaning that it is possible to output a high-resolution and high-precision pulse width modulated signal.

Also, the synthesizer includes a mask section which provides a mask in such a way that the pulse width modulated signal does not change when the counter is reset.

According to this pulse width modulation circuit, it is possible to stabilize the pulse width modulated signal when the counter is reset, and it is thereby possible to ensure the resolution of the pulse width modulated signal.

BRIEF DESCRIPTION OF THE DRAWINGS

The invention will be described with reference to the accompanying drawings, wherein like numbers reference like elements.

DESCRIPTION OF EXEMPLARY EMBODIMENTS

Next, a description will be given, as one embodiment of a pulse width modulation circuit of some aspects of the invention, of one which has been used in driving a digital power amplifier of a liquid jet printing apparatus.

Figure 1:
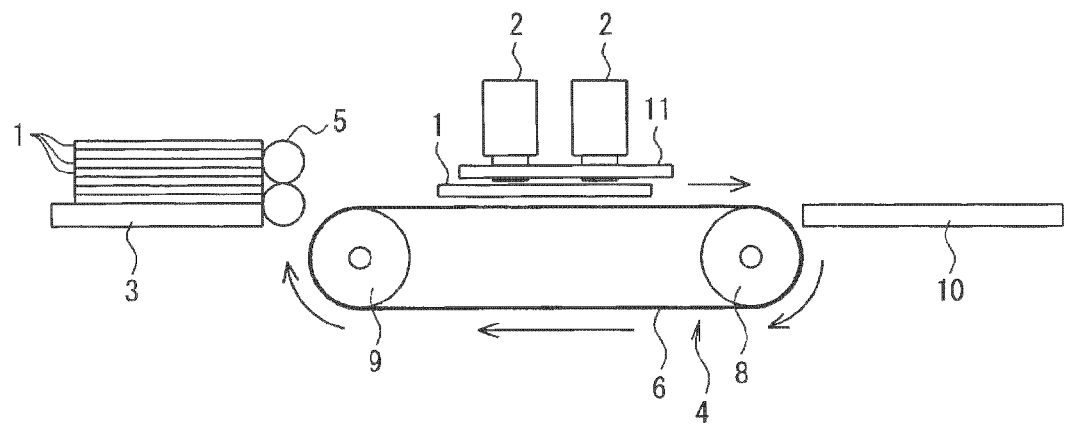
FIG. 1 is a front view of an outline configuration showing one embodiment of a liquid jet printing apparatus using a pulse width modulation circuit of some aspects of the invention.

FIG. 1 is an outline configuration diagram of the liquid jet printing apparatus of the embodiment, showing a line head printing apparatus wherein, in FIG. 1, a printing medium 1 is conveyed in a direction of the arrow from the left to right of the diagram, and printed on in a printing area halfway through the conveyance.

Figure 2:
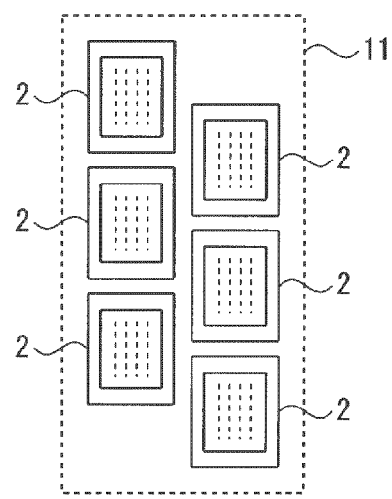
FIG. 2 is a plan view of a vicinity of liquid jet heads used in the liquid jet printing apparatus of FIG. 1.

Reference numerals 2 in FIG. 1 being a plurality of liquid jet heads provided above the conveyance line of the printing medium 1, they are fixed to a head fixing plate 11, disposed arranged in a direction perpendicular to a printing medium conveyance direction in such a way that they form two rows in the printing medium conveyance direction. A large number of nozzles being formed in the lowermost surface of each liquid jet head 2, the surface is called a nozzle surface. The nozzles being disposed in arrays in the direction perpendicular to the printing medium conveyance direction, one array for each of colors of liquids to be jetted, as shown in FIG. 2, the arrays are called nozzle arrays, and a direction of the arrays is called a nozzle array direction. A line head covering the whole of a width of the printing medium 1 in the direction perpendicular to the conveyance direction is formed by the nozzle arrays of all the liquid jet heads 2 disposed in the direction perpendicular to the printing medium conveyance direction. When the printing medium 1 passes below the nozzle surfaces of the liquid jet heads 2, the liquids are jetted from the large number of nozzles formed in the nozzle surfaces, carrying out a printing.

Liquids such as inks of four colors, yellow (Y), magenta (M), cyan (C), and black (K), are supplied to the liquid jet heads 2 from unshown liquid tanks via liquid supply tubes. Then, by jetting a necessary amount of liquid onto a necessary portion simultaneously from the nozzles formed in each liquid jet head 2, a minute dot is formed on the printing medium 1. By carrying this out for each color, it is possible to carry out a one-pass printing simply by causing the conveyed printing medium 1 to pass once through a conveyance section 4.

As a method of jetting the liquids from the nozzles of the liquid jet heads 2, there being an electrostatic method, a piezo method, a film boiling liquid jet method, and the like, the piezo method is used in the embodiment. The piezo method is a method such that, on giving a drive signal to a piezoelectric element which is an actuator, a diaphragm in a cavity is displaced, causing a pressure change in the cavity, and the liquid is jetted from a nozzle due to the pressure change. Then, by adjusting a crest value and voltage rise or fall gradient of the drive signal, it is possible to adjust a liquid jet amount. The invention is also similarly applicable to a liquid jet method other than the piezo method.

The conveyance section 4 for conveying the printing medium 1 in the conveyance direction is provided below the liquid jet heads 2. The conveyance section 4 being configured by winding a conveyor belt 6 around a drive roller 8 and a driven roller 9, an unshown electric motor is connected to the drive roller 8. An unshown adsorption device for adsorbing the printing medium 1 onto the front surface of the conveyor belt 6 is provided on the inner side of the conveyor belt 6. An air suction device which adsorbs the printing medium 1 onto the conveyor belt 6 due to a negative pressure, an electrostatic adsorption device which adsorbs the printing medium 1 onto the conveyor belt 6 with an electrostatic force, or the like, is used as the adsorption device.

Consequently, only one printing medium 1 is fed onto the conveyor belt 6 from a paper feed section 3 by a feed roller and, on the drive roller 8 being rotationally driven by the electric motor, the conveyor belt 6 is rotated in the printing medium conveyance direction, and the printing medium 1 is conveyed adsorbed onto the conveyor belt 6 by the adsorption device. A printing is carried out by jetting the liquids from the liquid jet heads 2 during this conveyance of the printing medium 1. The printing medium 1 for which the printing has been finished is discharged to a paper discharge section 10 on a downstream side in the conveyance direction. A printing reference signal output device configured of a linear encoder or the like is mounted on the conveyor belt 6. The printing reference signal output device, focusing on the fact that the conveyor belt 6 and the printing medium 1 conveyed adsorbed thereto are moved in synchronization, after the printing medium 1 has passed through a predetermined position in a conveyance path, outputs a pulse signal equivalent to a required printing resolution accompanying the movement of the conveyor belt 6 and, by a drive signal being output to actuators 22 from a drive circuit, to be described hereafter, in response to the pulse signal, the liquid of a predetermined color is jetted onto a predetermined position on the printing medium 1, and a predetermined image is drawn on the printing medium 1 with dots of the liquid.

Figure 3:
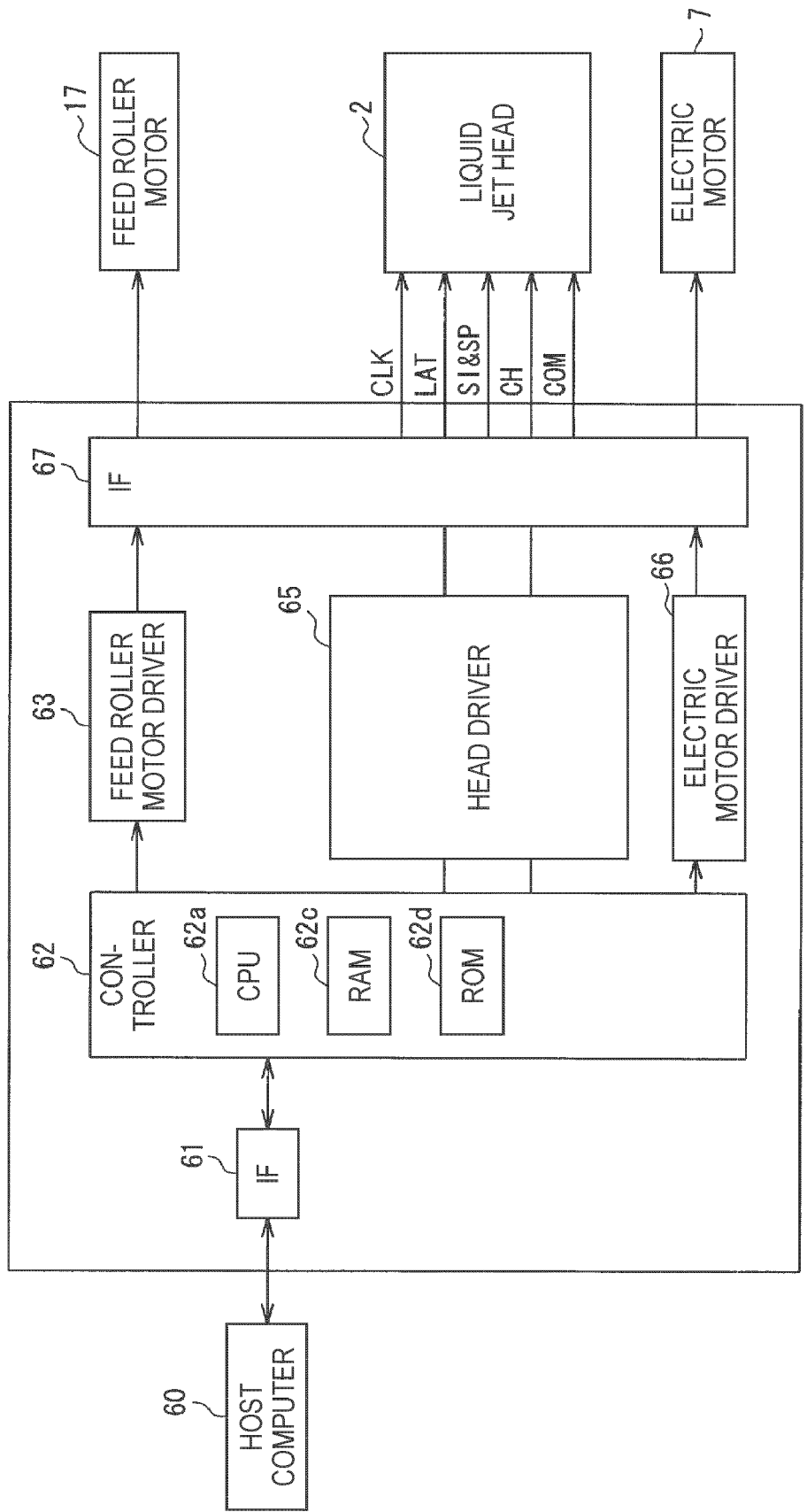
FIG. 3 is a block diagram of a control device of the liquid jet printing apparatus of FIG. 1.

A control device for controlling the liquid jet printing apparatus of the embodiment is provided in the liquid jet printing apparatus. As shown in FIG. 3, the control device is configured including an input interface 61 for reading print data input from a host computer 60, a controller 62 configured of a microcomputer which executes a computation process, such as a printing process, based on the print data input from the input interface 61, a feed roller motor driver 63 which controls the drive of a feed roller motor 17 connected to the feed roller 5, a head driver 65 which controls the drive of the liquid jet head 2, an electric motor driver 66 which controls the drive of the electric motor 7 connected to the drive roller 8, and an interface 67 which connects the feed roller motor driver 63, head driver 65, and electric motor driver 66, and the feed roller motor 17, liquid jet head 2, and electric motor 7.

The controller 62 includes a central processing unit (CPU) 62a which executes various kinds of process such as the printing process, a random access memory (RAM) 62c which temporarily stores the print data input via the input interface 61 or various kinds of data used to execute the process of printing the print data, or the like, or temporarily develops a program of the printing process or the like, and a read-only memory (ROM) 62d configured of a nonvolatile semiconductor memory which stores a control program or the like to be executed by the CPU 62a.

On the controller 62 receiving print data (image data) from the host computer 60 via the input interface 61, the CPU 62a executes a predetermined process on the print data, calculates nozzle selection data (drive pulse selection data) concerning from which nozzle to jet the liquid, or how much of the liquid to jet and, based on the print data and drive pulse selection data, and on data input from various kinds of sensor, outputs a drive signal and control signal to the feed roller motor driver 63, head driver 65, and electric motor driver 66. The feed roller motor 17, the electric motor 7, the actuator 22 in the liquid jet head 2, and the like, operate in response to the drive signal and control signal, executing a feed, conveyance, and discharge of the printing medium 1, and the printing process on the printing medium 1. The individual components in the controller 62 are electrically connected via an unshown bus.

Figure 4:
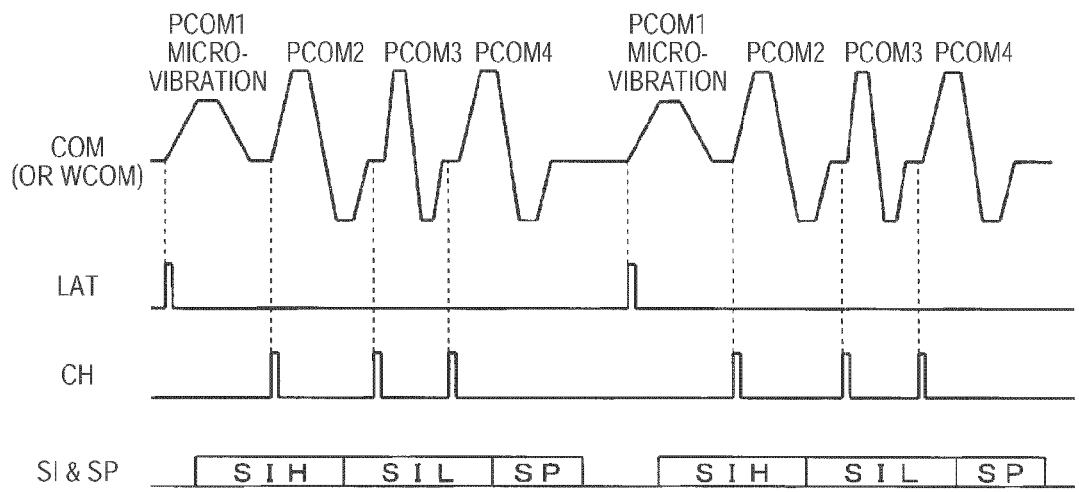
FIG. 4 is an illustration of a drive signal which drives an actuator in the liquid jet head.

FIG. 4 shows one example of a drive signal COM which, being supplied to the liquid jet head 2 from the control device of the liquid jet printing apparatus of the embodiment, is for driving the actuator 22 configured of a piezoelectric element. In the embodiment, it is taken to be a signal of which the potential changes with a midpoint potential as its center. The drive signal COM being one in which drive pulses PCOM acting as unit drive signals, which drive the actuator 22, jetting the liquid, are connected in a time series, a leading edge of each drive pulse PCOM is a stage at which the capacity of a cavity (a pressure chamber) communicating with a nozzle is enlarged to retract the liquid (it is also possible to say that a meniscus is retracted when considering a jet surface of the liquid), while a trailing edge of each drive pulse PCOM is a stage in which the capacity of the cavity is contracted to extrude the liquid (it is also possible to say that the meniscus is extruded when considering the jet surface of the liquid), and the liquid is extruded, as a result of which the liquid is jetted from the nozzle.

By variously changing the voltage rise or fall gradients or crest values of the drive pulses PCOM configured of voltage trapezoid waves, it is possible to change a retraction amount and retraction speed of the liquid, and an extrusion amount and extrusion speed of the liquid, and by thereby changing the liquid jet amount, it is possible to obtain differing sizes of dots. Consequently, even in the event that a plurality of the drive pulses PCOM are connected in a time series, by selecting a single drive pulse PCOM from them, supplying it to the actuator 22, and jetting the liquid, or by selecting a plurality of drive pulses PCOM, supplying them to the actuator 22, and jetting the liquid a plurality of times, it is possible to obtain various sizes of dots.

That is, when a plurality of droplets of the liquid, before being dried, land in the same position, it being essentially the same as a large droplet of the liquid being jetted, it is possible to increase the size of dots. It is possible to achieve a tone multiplication by combining these kinds of technology. A drive pulse PCOM1 at the left extremity of FIG. 4 simply retracts, but has not extruded, the liquid. This, being called a microvibration, is used to suppress and prevent an increase in viscosity of the nozzles without jetting the liquid.

Apart from the drive signal COM, drive pulse selection data SI&SP which, as well as selecting a nozzle which is to jet based on the print data, determine a timing at which the actuator 22 such as the piezoelectric element is connected to the drive signal COM, a latch signal LAT and channel signal CH which, after the nozzle selection data have been input into all the nozzles, bring the drive signal COM into connection with the actuator 22 of the liquid jet head 2 based on the drive pulse selection data SI&SP, and a clock signal CLK for transmitting the drive pulse selection data SI&SP to the liquid jet heads 2 as a serial signal, are input as control signals into the liquid jet head 2 from the control device of FIG. 3.

Hereafter, the minimum unit of the drive signal which drives the actuator 22 will be taken to be the drive pulse PCOM, and the whole of a signal in which the drive pulses PCOM are connected in a time series will be described as the drive signal COM. That is, a series of drive signals COM starts to be output with the latch signal LAT, and the drive pulse PCOM is output for each channel signal CH.

Figure 5:
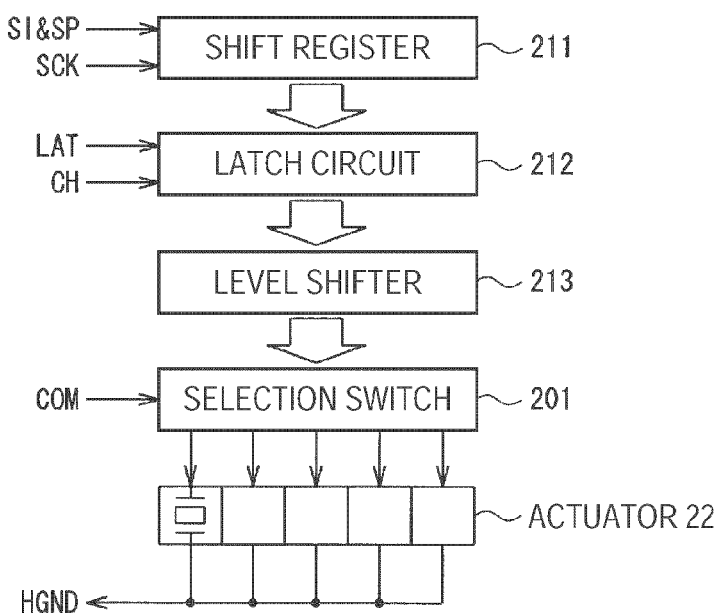
FIG. 5 is a block diagram of a switching controller.

FIG. 5 shows a specific configuration of a switching controller constructed in the liquid jet head 2 in order to supply the drive signal COM (drive pulses PCOM) to the actuator 22. The switching controller is configured including a shift register 211 which saves the drive pulse selection data SI&SP for specifying the actuator 22 such as the piezoelectric element corresponding to the nozzle which jets the liquid, a latch circuit 212 which temporarily saves data of the shift register 211, and a level shifter 213 which, by level converting an output from the latch circuit 212 and supplying it to a selection switch 201, connects the drive signal COM to the actuator 22 such as the piezoelectric element.

As well as the drive pulse selection data SI&SP being sequentially input into the shift register 211, a storage area is shifted sequentially from a first stage to a subsequent stage in accordance with an input pulse of the clock signal CLK. The latch circuit 212, after drive pulse selection data SI&SP equivalent to the number of nozzles have been stored in the shift register 211, latches a signal output from the shift register 211 with the input latch signal LAT. The signal saved to the latch circuit 212 is converted by the level shifter 213 into a voltage level at which the selection switch 201 at the next stage can be turned on or off. This is because the drive signal COM is of a high voltage in comparison with the output voltage of the latch circuit 212, in accordance with which the operational voltage range of the selection switch 201 is also set to be high.

Consequently, the actuator 22 such as the piezoelectric element for which the selection switch 201 is closed by the level shifter 213 is connected to the drive signal COM (drive pulses PCOM) at a time at which the drive pulse selection data SI&SP are connected. Also, after the drive pulse selection data SI&SP of the shift register 211 have been saved to the latch circuit 212, next print information is input into the shift register 211, and the data saved to the latch circuit 212 are sequentially updated in accordance with a liquid jet timing. Reference character HGND in FIG. 5 is a ground extremity of the actuator 22 such as the piezoelectric element. Also, even after the actuator 22 such as the piezoelectric element has been separated from the drive signal COM (drive pulses PCOM) by the selection switch 201, the input voltage of the relevant actuator 22 is maintained at the voltage immediately before the separation.

Figure 6:
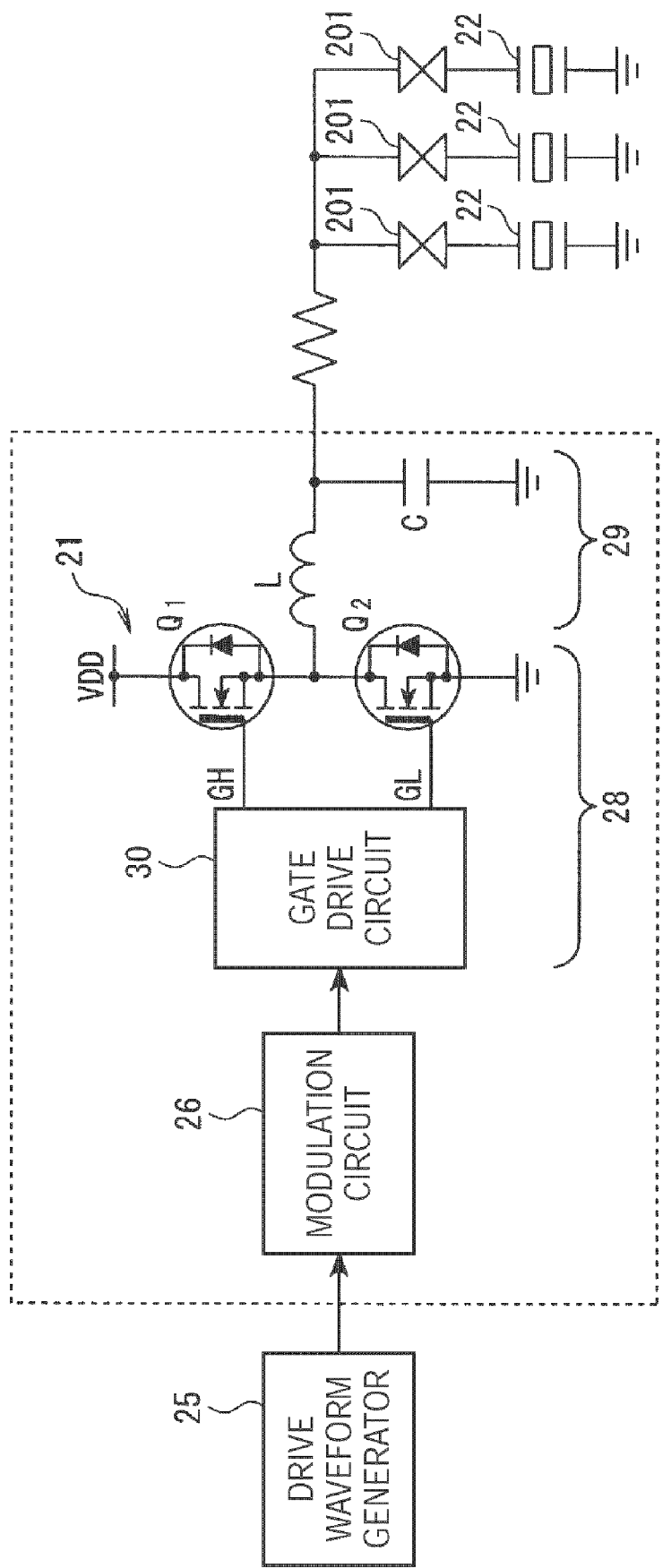
FIG. 6 is a block diagram showing one example of a drive circuit of the actuator.

FIG. 6 shows a configuration of the drive circuit of the actuator 22. The drive circuit of the actuator 22 is constructed in the controller 62 and head driver 65 in the previously described control device. The drive circuit of the embodiment is configured including a drive waveform generator 25 which, based on drive waveform data stored in advance, generates a drive waveform signal WCOM which is the source of the drive signal COM (drive pulses PCOM), that is, a reference of a signal controlling the drive of the actuator 22, a modulation circuit 26 which modulates the pulse of the drive waveform signal WCOM generated by the drive waveform generator 25, a digital power amplifier 28 which amplifies the power of the modulated signal pulse modulated by the modulation circuit 26, a low pass filter 29 which smoothes the amplified digital signal power-amplified by the digital power amplifier 28, and supplies it from the selection switch 201 to the actuator 22 as the drive signal COM (drive pulses PCOM).

The drive waveform generator 25, based on the drive waveform data output from the CPU 62a, outputs the drive waveform signal WCOM which has been sampled in a predetermined sampling cycle, and quantized with a predetermined number of bits. In the embodiment, a pulse width modulation (PWM) circuit is used as the modulation circuit 26 which modulates the pulse of the drive waveform signal WCOM. The pulse width modulation circuit compares a reference signal, such as a triangle wave signal or a sawtooth wave signal, and the drive waveform signal WCOM, and outputs, as the modulated signal, a pulse signal which comes on duty when the drive waveform signal WCOM is larger than the reference signal.

Details of the pulse width modulation circuit will be described at a subsequent stage. The digital power amplifier 28 is configured including a half bridge output stage 21 configured of a high side switching element Q1 and low side switching element Q2 for essentially amplifying power, and a gate drive circuit 30 for adjusting gate-source signals GH and GL of the high side switching element Q1 and low side switching element Q2 based on the modulated signal from the modulation circuit 26. Also, the low pass filter 29 being configured of a low pass filter configured of a combination of a coil L and a capacitor C, a modulation cycle component of an amplified digital signal, in this case, a frequency component of the reference signal, is removed by the low pass filter.

With the digital power amplifier 28, when the modulated signal is at a high level, as the gate-source signal GH of the high side switching element Q1 reaches a high level, and the gate-source signal GL of the low side switching element Q2 reaches a low level, the high side switching element Q1 attains an on condition, and the low side switching element Q2 attains an off condition, as a result of which the output of the half bridge output stage 21 reaches a supply voltage VDD. Meanwhile, when the modulated signal is at a low level, as the gate-source signal GH of the high side switching element Q1 reaches a low level, and the gate-source signal GL of the low side switching element Q2 reaches a high level, the high side switching element Q1 attains an off condition, and the low side switching element Q2 attains an on condition, as a result of which the output of the half bridge output stage 21 reaches zero.

When the high side and low side switching elements are digitally driven in this way, a current flows through a switching element in the on condition but, a drain-source resistance value being very small, hardly any power loss occurs. Also, as no current flows through a switching element in the off condition, no power loss occurs. Consequently, the power loss itself of the digital power amplifier 28 being extremely small, it is possible to use a switching element such as a small MOSFET.

Figure 7:
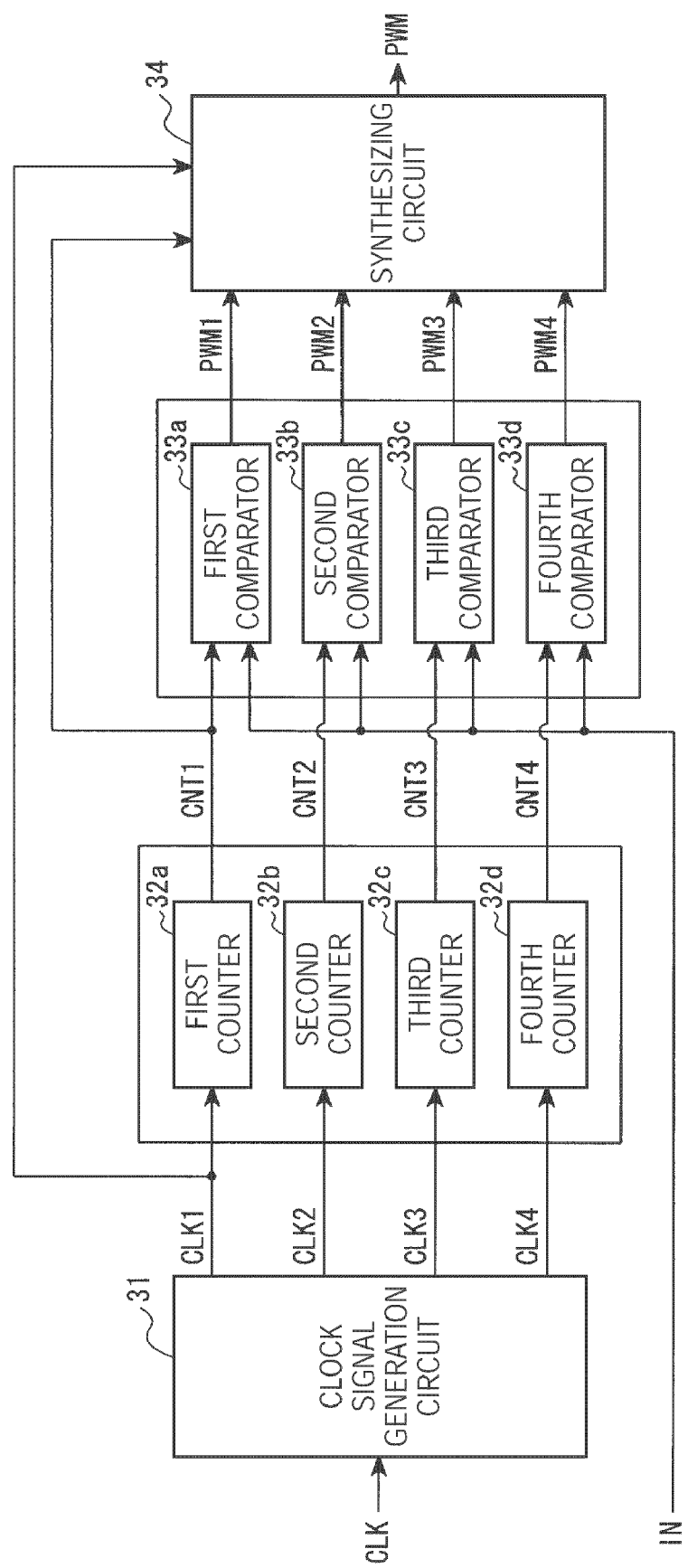
FIG. 7 is a block diagram showing a first embodiment of a pulse width modulation circuit of some aspects of the invention which is used in a modulation circuit of FIG. 6.

FIG. 7 shows a first embodiment of the pulse width modulation circuit used as the previously described modulation circuit 26. With the pulse width modulation circuit, a clock signal generation circuit 31, by dividing or multiplying the clock signal CLK, and shifting the phases, generates first to fourth clock signals CLK1 to CLK4 with mutually differing phases, and first to fourth counters 32a to 32d count the clock signals CLK1 to CLK4, and output results of the count as first to fourth reference signals CNT1 to CNT4. The count increases or decreases by a predetermined value set in advance at each rise of the clock signals CLK1 to CLK4.

The reference signals CNT1 to CNT4 become sawtooth wave signals by configuring in such a way that the count increases by the predetermined value at each rise of the clock signals CLK1 to CLK4, and the count value is reset in the event that a predetermined time elapses, or the count value becomes a predetermined value or more. Meanwhile, the reference signals CNT1 to CNT4 become triangle wave signals by configuring in such a way that the count increases by the predetermined value set in advance at each rise of the clock signals CLK1 to CLK4, the count decreases by a predetermined value the same as the predetermined value when it increases, at each rise of the clock signals CLK1 to CLK4, in the event that a predetermined time elapses, or the count value becomes a predetermined value or more, and the count value is increased by predetermined value increments again in the event that a predetermined time elapses, or the count value becomes a predetermined value or less. In the first embodiment, the phases of the first to fourth clock signals CLK1 to CLK4 are shifted 90 degrees each in the order named.

Also, with the counters 32a to 32d, the increase start or decrease start initial values offset of their count values are set to be mutually differing values. Specifically, a configuration is such that the offset value of the first counter 32a, which counts the first clock signal CLK1 with the earliest phase, is smallest, and next, the offset values of the second counter 32b, third counter 32c, and fourth counter 32d increase in the order named.

Then, first to fourth comparators 33a to 33d compare the first to fourth reference signals CNT1 to CNT4 and an input signal IN, in this case, the previously described drive waveform signal WCOM, and in the event that the input signal IN is larger than the reference signals CNT1 to CNT4, output signals with a high level, that is, a logical value "1", while in the event that the input signal IN is smaller than the reference signals CNT1 to CNT4, they output signals with a low level, that is, a logical value "0", as first to fourth comparison signals (which are essentially the same as the pulse width modulated signals) PWM1 to PWM4. A synthesizing circuit 34 logically calculates a logical sum or logical product of the first to fourth comparison signals PWM1 to PWM4, and outputs a result of the logical operation as a final pulse width modulated signal PWM.

With the pulse width modulation circuit, as the reference signals CNT1 to CNT4 are generated from the clock signals CLK1 to CLK4 with mutually differing phases, the phases of the reference signals CNT1 to CNT4 also differ from one another. As the reference signals CNT1 to CNT4 with mutually differing phases and the input signal IN are compared, and results of the comparisons are output as the comparison signals PWM1 to PWM4, the phases of the comparison signals PWM1 to PWM4 also differ.

However, the final pulse width modulated signal PWM configured of the logical sum or logical product of the comparison signals PWM1 to PWM4 becomes one of which a timing at which it comes on duty, or a timing at which it comes off duty, is advanced or delayed by a phase difference between the clock signals CLK1 to CLK4 and, as a result, attains several times as many clock signals, that is, a resolution four times as high, as in a case of only one of the clock signals CLK1 to CLK4. Even so, as the frequency of the clock signals CLK1 to CLK4 themselves remains at that of the single clock signal, the calculation of the comparison between the reference signals and the input signal is also easy, stabilizing an internal calculation process. Also, as the resolution of the pulse width modulated signal PWM is increased without lowering the frequency of the reference signals CNT1 to CNT4, a high speed response is also possible.

Figure 8:
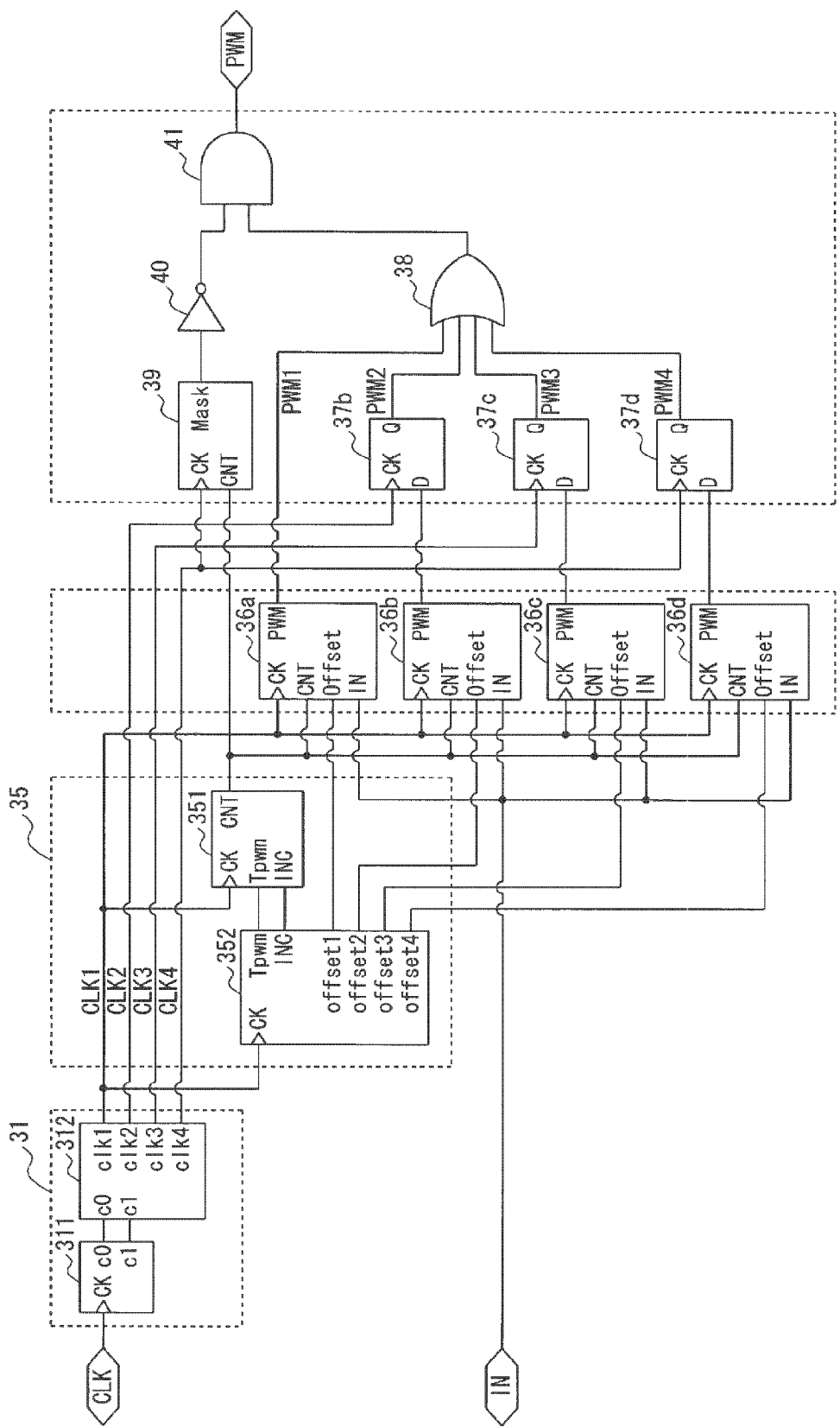
FIG. 8 is a block diagram showing a second embodiment of a pulse width modulation circuit of some aspects of the invention which is used in the modulation circuit of FIG. 6.

Details of the high resolution and high speed response due to the pulse width modulation circuit of some aspects of the invention will be described in a differing embodiment. FIG. 8 is a block diagram showing a second embodiment of the pulse width modulation circuit of some aspects of the invention. Although the diagram is divided into blocks, actually, it is also acceptable to construct it with the computation process using the program.

In the second embodiment, there is only one clock signal counter. A clock signal generation circuit 31 having a function equivalent to that of FIG. 7 is provided with a phase locked loop (PLL) circuit 311 which outputs clock signals, a frequency of which equals to the integral multiple of the frequency of the clock signals CLK, and a multiphase clock circuit 312 which outputs first to fourth clock signals CLK1 to CLK4 with phases shifted 90 degrees each, that is, with mutually differing phases, from the clock signals equal to the integral multiple. It is also acceptable to use a delay locked loop (DLL) circuit in place of the PLL circuit.

The counter circuit 35 counts only the first clock signal CLK1, among the clock signals CLK1 to CLK4, using the counter 351, and outputs a voltage signal in accordance with the count value as the reference signal CNT. The counter circuit 35 is provided with a pulse width modulation management circuit 352 which gives increase start initial values offset1 to offset4 to first to fourth adders and comparators 36a to 36d, to be described hereafter. Also, on a reset signal being output from a mask circuit, to be described hereafter, the counter 351 resets the count value.

The first to fourth adders and comparators 36a to 36d read the reference signal CNT of the counter 351 at a rise of the first clock signal CLK1, calculate the first to fourth reference signals CNT1 to CNT4 by adding it to the first to fourth increase start initial values offset1 to offset4 from the pulse width modulation management circuit 352, compare the reference signals CNT1 to CNT4 and an input signal IN, in this case, the previously described drive waveform signal WCOM, and in the event that the input signal IN is larger than the reference signal CNT1 to CNT4, output signals with a high level, that is, a logical value "1", while in the event that the input signal IN is smaller than the reference signals CNT1 to CNT4, they output signals with a low level, that is, a logical value "0", as the first to fourth comparison signals PWM1 to PWM4.

However, the second to fourth comparison signals PWM2 to PWM4 are output synchronized with a rise of the second to fourth clock signals CLK2 to CLK4 by second to fourth synchronization circuits (a first synchronization circuit does not exist, but the second to fourth synchronization circuits are taken in order to match reference numerals and characters, and facilitate an understanding) 37b to 37d. A logical sum of the output first to fourth clock signals CLK1 to CLK4 is logically calculated and output by an OR circuit 38.

The mask circuit 39 reads the count value of the counter 351 in accordance with a rise of the fourth clock signal CLK4 and, in the event that the count value becomes a predetermined value or more, outputs a reset signal RESET with a high level, that is, a logical value "1", until a next rise of the fourth clock signal CLK4. The reset signal RESET is inverted by a NOT circuit 40, and input into an AND circuit 41 together with the previously mentioned output from the OR circuit 38. The AND circuit 41 logically calculates a logical product of the output from the OR circuit 38 and the output from the NOT circuit 40, and outputs a result of the logical operation as a final pulse width modulated signal PWM.

Figure 9:
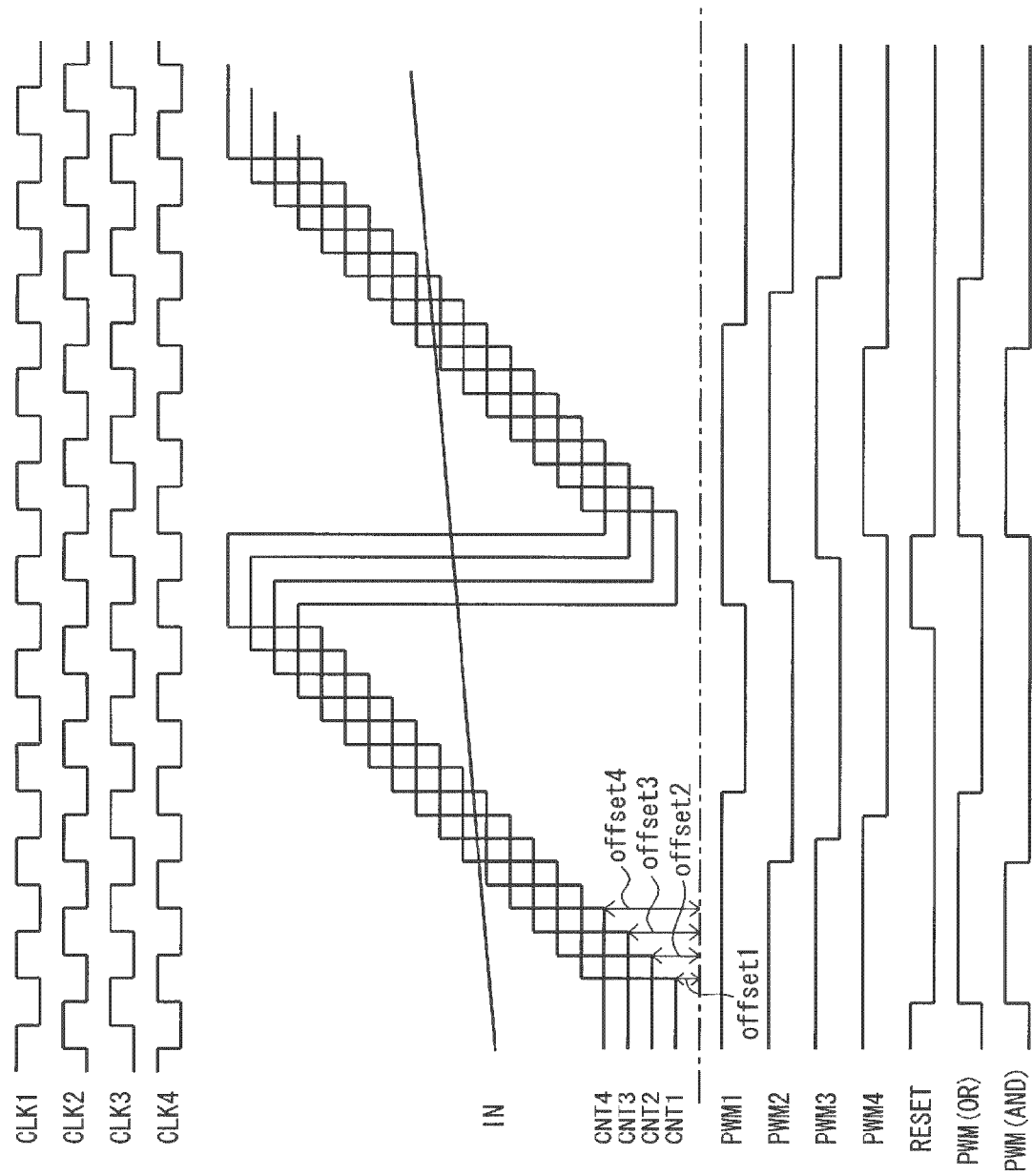
FIG. 9 is an illustration of an operation of the pulse width modulation circuit of FIG. 8.

FIG. 9 shows a temporal change of the clock signals CLK1 to CLK4, reference signals CNT1 to CNT4, comparison signals PWM1 to PWM4, reset signal RESET, and final pulse width modulated signal PWM (OR) of the pulse width modulation circuit of FIG. 8. The pulse width modulated signal PWM (AND) in FIG. 9 is a final pulse width modulated signal in the event that an AND circuit is interposed in place of the OR circuit 38. Also, the increase start initial values offset1 to offset4 increase in increments of a constant value, as shown in FIG. 9, thereby giving a voltage difference to the initial values of the reference signals CNT1 to CNT4.

As a result of this, the fourth reference signal CNT4 with a highest potential tends to come off duty at a latest timing, but depending on a condition of the input signal IN, it may happen that this is not the case. Both the pulse width modulated signal PWM (OR) configured of the logical sum of the comparison signals PWM1 to PWM4 which are the results of the comparison of the reference signals CNT1 to CNT4, and the pulse width modulated signal PWM (AND) configured of the logical product, by being compared with only one of the pulse width modulated signals PWM1 to PWM4, are found to accurately capture the characteristics of the input signal IN, and be of a high resolution. Also, in the same way as previously described, with the clock signals CLK1 to CLK4, as the frequency thereof is not so high, the internal calculation process is stabilized. Also, as the resolution of the pulse width modulated signal PWM is increased without lowering the frequency of the reference signals CNT1 to CNT4, the high-speed response is also possible.

Incidentally, as is understood by comparing the pulse width modulated signal PWM (OR) configured of the logical sum, and the pulse width modulated signal PWM (AND) configured of the logical product, of the comparison signals PWM1 to PWM4, the pulse width modulated signal PWM (OR) configured of the logical sum is output in a condition in which the off duty timing is a predetermined amount later than that of the pulse width modulated signal PWM (AND) configured of the logical product. For this reason, it is sufficient to configure in such a way as to use the pulse width modulated signal PWM (OR) configured of the logical sum in the event of wanting to set an output duty ratio corresponding to an input signal level to be relatively high, and the pulse width modulated signal PWM (AND) configured of the logical product in the event of wanting to set the duty ratio to be relatively low. Alternatively, it is also acceptable to configure in such away as to output both the pulse width modulated signals PWM (OR) and PWM (AND) in advance, and furthermore, use them as appropriate at a subsequent stage.

Also, in the event of utilizing this tendency in reverse, it is also possible to fine adjust the off duty timing. That is, by delaying a trailing edge of the pulse width modulated signal PWM (AND) configured of the logical product by $\frac{2}{4}$ ($=\frac{1}{2}$) of the first clock signal CLK1, it is possible to set the off duty timing to be midway between the pulse width modulated signal PWM (OR) configured of the logical sum and the pulse width modulated signal PWM (AND) configured of the logical product.

Also, when the reference signals CNT1 to CNT4 and the input signal IN are compared by the adders and comparators 36a to 36d, it is also possible to give a hysteresis as a measure against noise. That is, it is sufficient that the reference signals CNT1 to CNT4 when the comparison signals PWM1 to PWM4 switch from the on duty to the off duty are set to be slightly high, and that the reference signals CNT1 to CNT4 when the comparison signals PWM1 to PWM4 switch from the off duty to the on duty are set to be slightly low.

Figure 10:
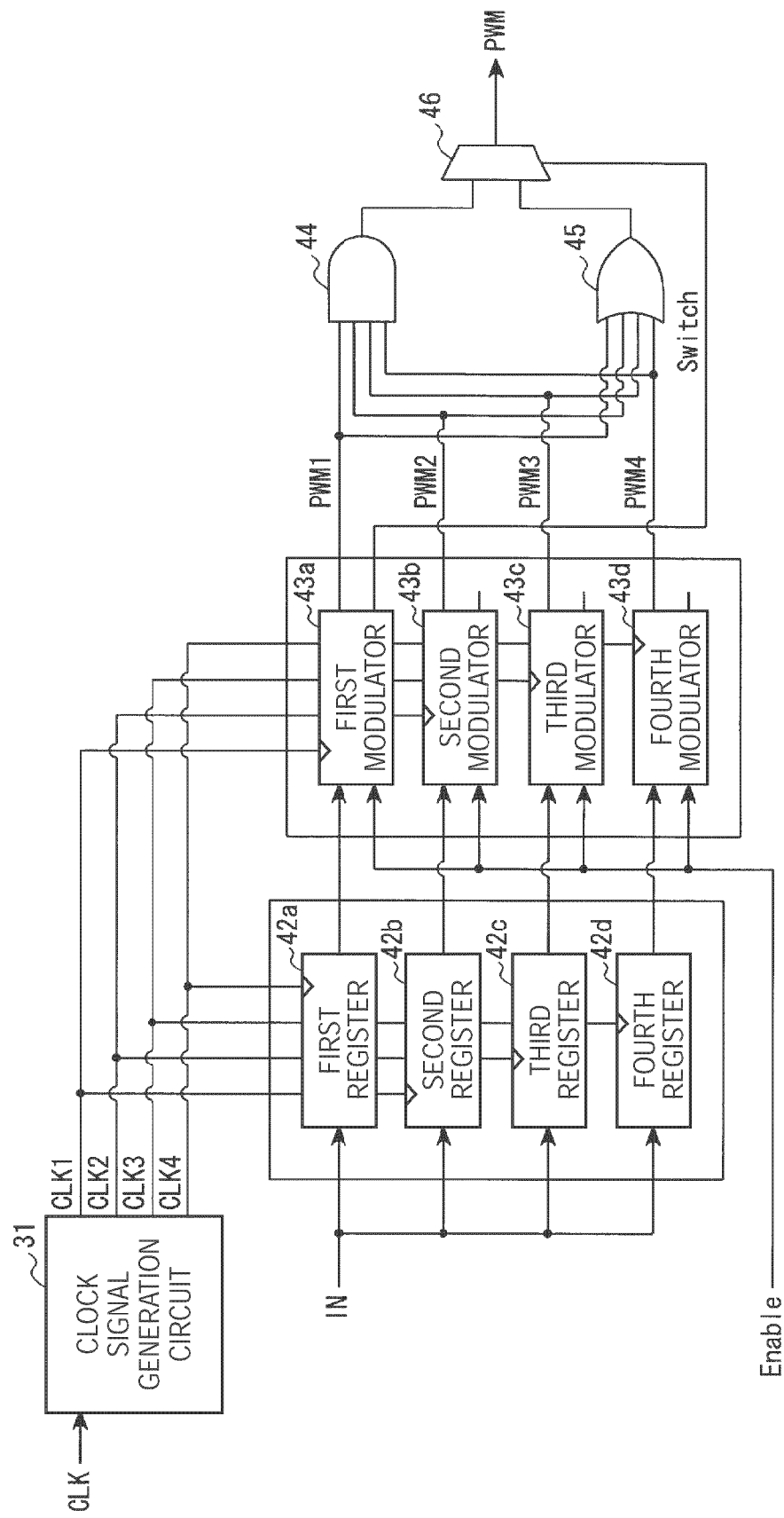
FIG. 10 is a block diagram showing a third embodiment of a pulse width modulation circuit of some aspects of the invention which is used in the modulation circuit of FIG. 6.

FIG. 10 is a block diagram showing a third embodiment of the pulse width modulation circuit of some aspects of the invention. In the third embodiment too, although the diagram is also divided into blocks, actually, it is also acceptable to construct it with the computation process using the program. In FIG. 10, a clock signal generation circuit 31, having the same functions as those of the first embodiment and second embodiment, generates first to fourth clock signals CLK1 to CLK4 with mutually differing phases, specifically, with phases shifted 90 degrees each, from the previously described clock signal CLK.

Among first to fourth registers 42a to 42d which read an input signal IN, in this case, a drive waveform signal WCOM, the first register 42a reads the input signal IN at a rise of a fourth clock signal CLK4, the second register 42b reads the input signal IN at a rise of a first clock signal CLK1, the third register 42c reads the input signal IN at a rise of a second clock signal CLK2, and the fourth register 42d reads the input signal IN at a rise of a third clock signal CLK3. These read the input signal IN prior to a timing of a comparison between reference signals CNT1 to CNT4 in modulators 43a to 43d, to be described hereafter, and the input signal IN.

An enable signal Enable which permits a pulse width modulation itself is input into the first to fourth modulators 43a to 43d which carry out a comparison between the input signal IN and the reference signals, to be described hereafter, and which output first to fourth comparison signals PWM1 to PWM4 and when the enable signal Enable is at a high level, that is, of a logical value "1", the first modulator 43a compares the value of the input signal IN stored in the first register 42a and the reference signal at the rise of the first clock signal CLK1, and outputs a first comparison signal PWM1, the second modulator 43b compares the value of the input signal IN stored in the second register 42b and the reference signal at the rise of the second clock signal CLK2, and outputs a second comparison signal PWM2, the third modulator 43c compares the value of the input signal IN stored in the third register 42c and the reference signal at the rise of the third clock signal CLK3, and outputs a third comparison signal PWM3, and the fourth modulator 43d compares the value of the input signal IN stored in the fourth register 42d and the reference signal at the rise of the fourth clock signal CLK4, and outputs a fourth comparison signal PWM4.

The first modulator 43a outputs a switching signal Switch which switches a selection switch 46, to be described hereafter. All the first to fourth pulse modulated signals PWM1 to PWM4 are input in parallel into an AND circuit 44 and OR circuit 45, and outputs therefrom are switched by the selection switch 46 in response to the switching signal Switch.

Figure 11:
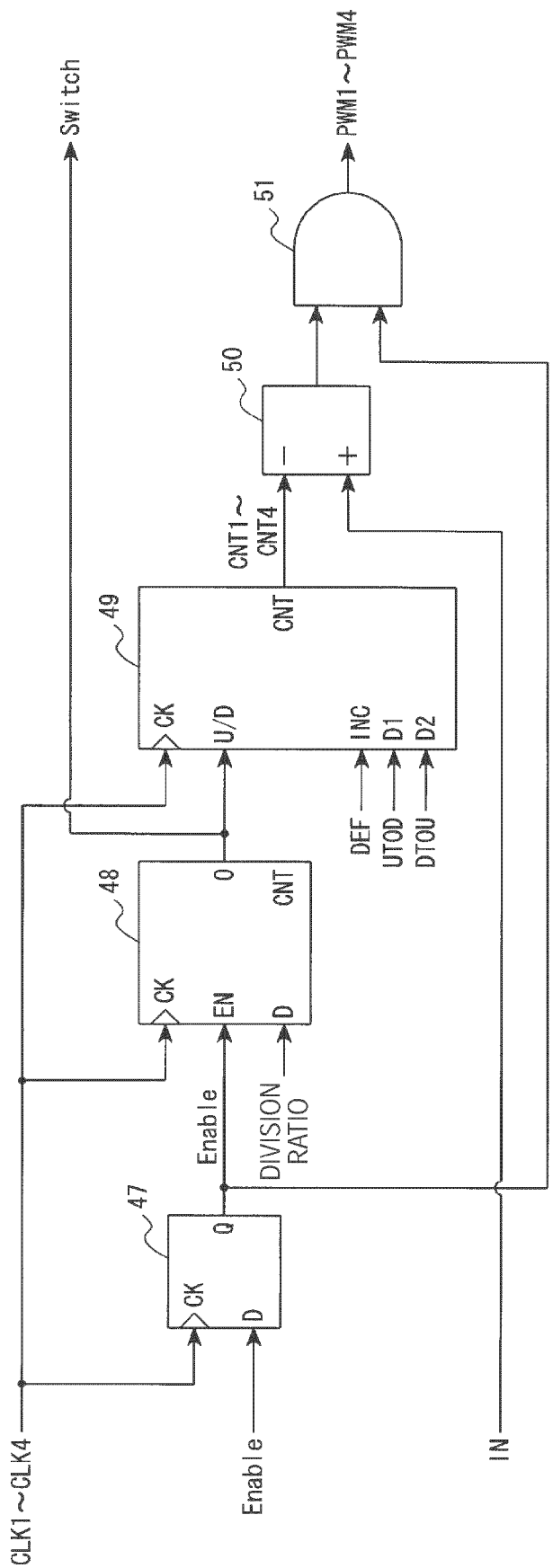
FIG. 11 is a block diagram showing details of a modulator of the pulse width modulation circuit of FIG. 10.

FIG. 11 shows details of the first to fourth modulators 43a to 43d. The first to fourth modulators 43a to 43d, by switching between an increase and decrease of count values in accordance with the clock signals CLK1 to CLK4 in each predetermined cycle, generate triangle wave signals as the reference signals, compare the triangle wave signals and the input signal IN, and output the comparison signals PWM1 to PWM4. For this reason, each modulator 43a to 43d includes a count controller 47, a divider (a counter) 48, an up/down counter 49, a comparator 50, and an AND circuit 51. The count controller 47, when an enable signal Enable is at a high level, outputs the enable signal Enable to a subsequent stage at a rise of the clock signals CLK1 to CLK4.

The divider (counter) 48 reads the enable signal Enable from the count controller 47 and a division ratio corresponding to one cycle of the triangle wave signals, counts the clock signals CLK1 to CLK4, and outputs a switching signal Switch which switches between a high level, that is, a logical value "1", and a low level, that is, a logical value "0", in each half cycle of the triangle wave signals. The up/down counter 49 reads increase or decrease values DEF, decrease start initial values UTOD, and increase start initial values DTOU, to be described hereafter, repeats the increase or decrease by the increase or decrease value DEF at each rise of the clock signals CLK1 to CLK4, and outputs the reference signals CNT1 to CNT4, and also, switches between the increase and decrease every time a switching signal Switch corresponding to the half cycle of the triangle wave signals switches.

The comparator 50 compares the reference signals CNT1 to CNT4 output from the up/down counter 49 and the input signal IN, and when the input signal IN is larger than the reference signals CNT1 to CNT4, outputs comparison signals PWM1 to PWM4 with a high level, that is, a logical value "1", while when the input signal IN is smaller than the reference signals CNT1 to CNT4, it outputs comparison signals PWM1 to PWM4 with a low level, that is, a logical value "0". The AND circuit 51, only when the enable signal Enable is at a high level, allows the comparison signals PWM1 to PWM4 to pass through, and outputs them.

Figure 12A:
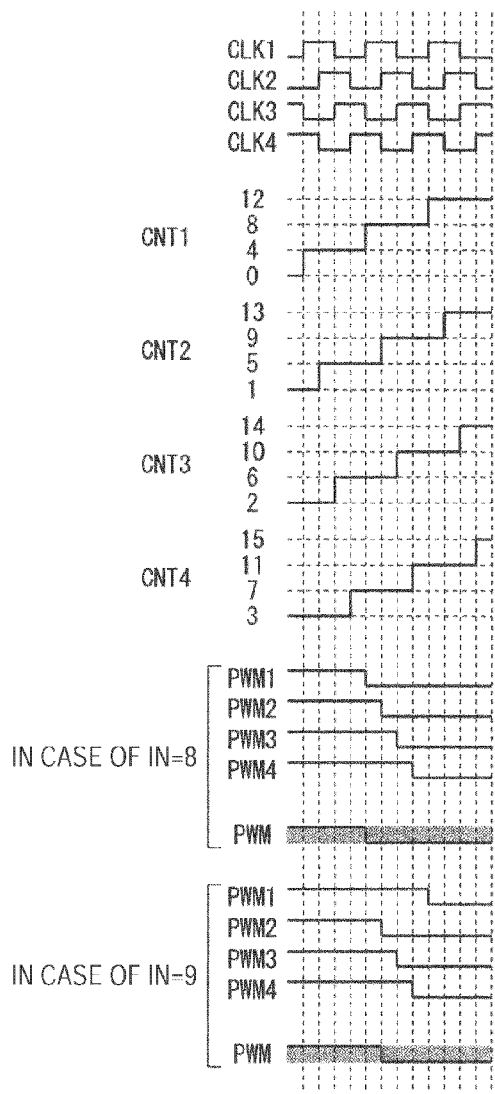
FIGS. 12A and 12B are illustrations of an operation of the pulse width modulation circuit of FIG. 10.
Figure 12B:
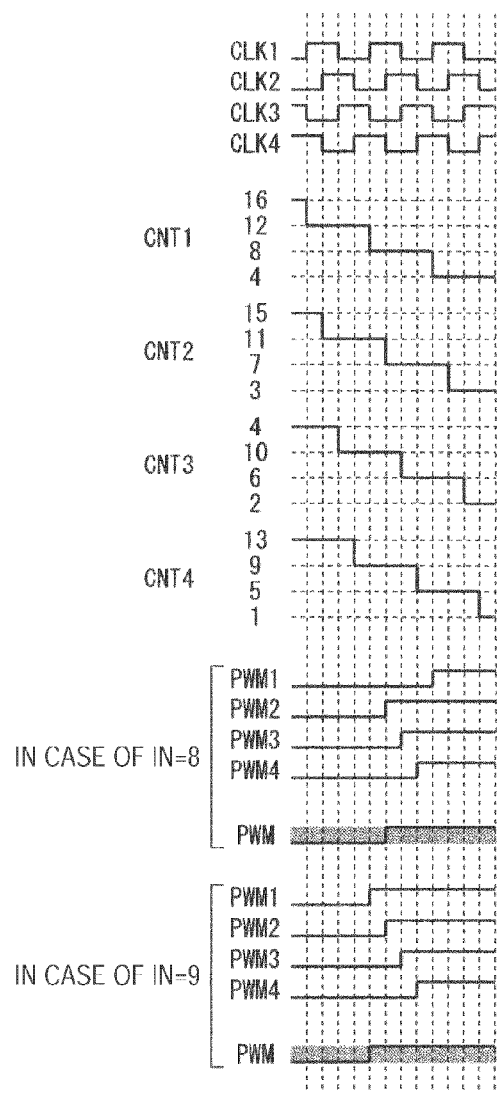

FIGS. 12A and 12B show a temporal change of clock signals CLK1 to CLK4, reference signals CNT1 to CNT4, comparison signals PWM1 to PWM4, and a final pulse width modulated signal PWM, of the third embodiment. FIG. 12A shows a time of an increase of count values of the up/down counter 49, that is, the reference signals CNT1 to CNT4, while FIG. 12B shows a time of a decrease of the reference signals CNT1 to CNT4. In this description, the increase or decrease value DEF of the up/down counter 49 is taken to be 4, the increase start initial value DTOU of the first reference signal CNT1 to be 0, and the decrease start initial value UTOD to be 16.

In the same way, the increase start initial value DTOU of the second reference signal CNT2 is taken to be 1, and the decrease start initial value UTOD thereof to be 15, the increase start initial value DTOU of the third reference signal CNT3 is taken to be 2, and the decrease start initial value UTOD thereof to be 14, and the increase start initial value DTOU of the fourth reference signal CNT4 is taken to be 3, and the decrease start initial value UTOD thereof to be 13. Also, a configuration is such that an output from the AND circuit 44 is selected as the final pulse width modulated signal PWM when the reference signals CNT1 to CNT4 increase, and an output from the OR circuit 45 is selected as the final pulse width modulated signal PWM when the reference signals CNT1 to CNT4 decrease, in response to the switching signal Switch.

On mutually differing increase start initial values DTOU and decrease start initial values UTOD being set in this way, and the reference signals CNT1 to CNT4 increasing or decreasing at the rise of the clock signals CLK1 to CLK4 with mutually differing phases, the potentials and phases of the reference signals CNT1 to CNT4 are shifted a little at a time.

Figures 13A, 13B:
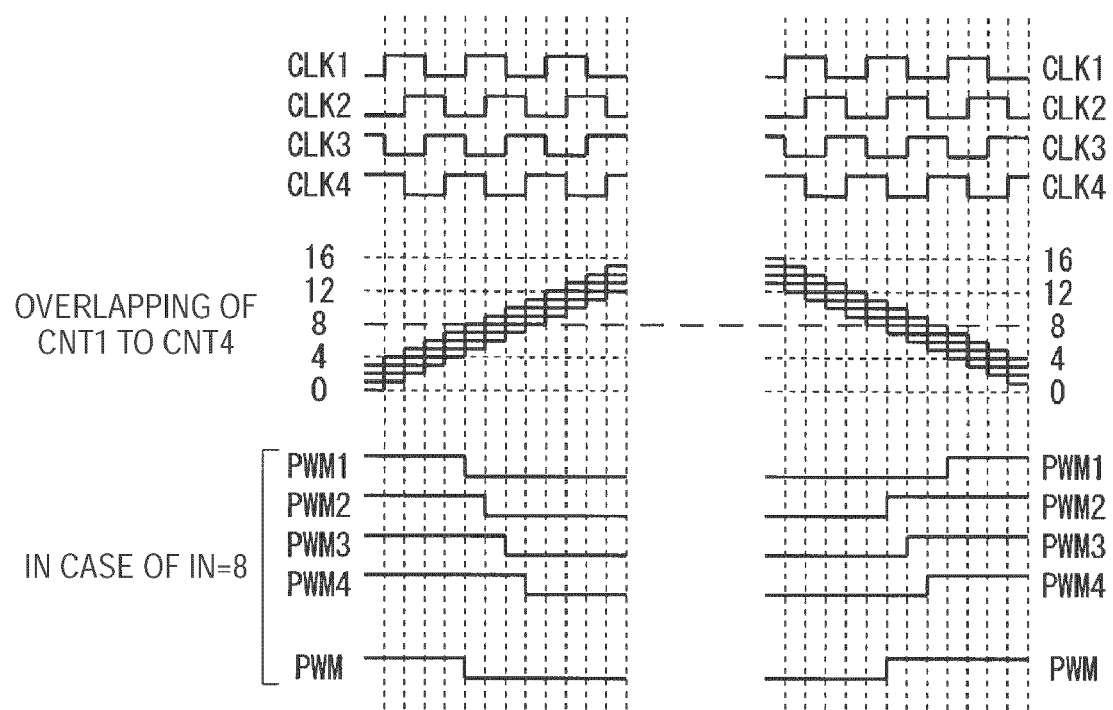
FIGS. 13A and 13B are illustrations of an operation of the pulse width modulation circuit of FIG. 10.

FIGS. 13A and 13B show images in which the reference signals CNT1 to CNT4 are overlapped. On comparing these kinds of reference signal CNT1 to CNT4 and an input signal IN of which the value is "8", it is found that timings at which the comparison signals PWM1 to PWM4 corresponding to the reference signals CNT1 to CNT4 come on duty, and timings at which they come off duty, are also slightly shifted. As an output from the AND circuit 44 is selected when the reference signals CNT1 to CNT4 increase as shown in FIGS. 12A and 13A, only when all the comparison signals PWM1 to PWM4 are on duty, the final pulse width modulated signal PWM also becomes on duty, that is, a high level.

Also, as an output from the OR circuit 45 is selected when the reference signals CNT1 to CNT4 decrease as shown in FIGS. 12B and 13B, when any of the comparison signals PWM1 to PWM4 is on duty, the final pulse width modulated signal PWM becomes on duty, that is, a high level. The final pulse width modulated signals PWM when the value of the input signal is "8", and when it is "9", are shown in FIGS. 12A and 12B. As is apparent from the same diagrams, both when the reference signals CNT1 to CNT4 increase, and when they decrease, timings at which the final pulse width modulated signals PWM when the value of the input signal IN is "8", and when it is "9", are off duty, or timings at which they are on duty, are equivalent to a phase difference between the clock signals CLK1 to CLK4, that is, 90 degrees, showing an extremely high resolution.

Also, by configuring in such a way as to select the output from the AND circuit 44, that is, the logical product, when the reference signals CNT1 to CNT4 increase, and the output from the OR circuit 45, that is, the logical sum, when the reference signals CNT1 to CNT4 decrease, a narrow margin of the previously described duty ratio of the two is cancelled out. As heretofore known, it is possible to slightly reduce a waveform distortion in the case of using the triangle wave signals as the reference signals in comparison with the case of using the sawtooth wave signals.

Table 1 described below shows one example of specific increase or decrease values DEF, decrease start initial values UTOD, and increase start initial values DTOU of the reference signals CNT1 to CNT4, which are counted by the up/down counter 49. That is, the reference signal CNT1 starts an increase from an increase start initial value 0, increases by 128 at each rise of the clock signal CLK1, changes to a decrease when the count value becomes a decrease start initial value 1024, and decreases by 128 at each rise of the clock signal CLK1. Also, the reference signal CNT4 starts an increase from an increase start initial value 96, increases by 128 at each rise of the clock signal CLK4, changes to a decrease when the count value becomes a decrease start initial value 928, and decreases by 128 at each rise of the clock signal CLK4.

TABLE 1

|  | Clock | | | |
| --- | --- | --- | --- | --- |
|  | CLK1 (0°) | CLK2 (90°) | CLK3 (180°) | CLK4 (270°) |
| Reference signal | CNT1 | CNT2 | CNT3 | CNT4 |
| Increase or decrease value (DEF) | 128 | 128 | 128 | 128 |
| Decrease start initial value (UTOD) | 1024 | 992 | 960 | 928 |
| Increase start initial value (DTOU) | 0 | 32 | 64 | 96 |

Figure 14A:
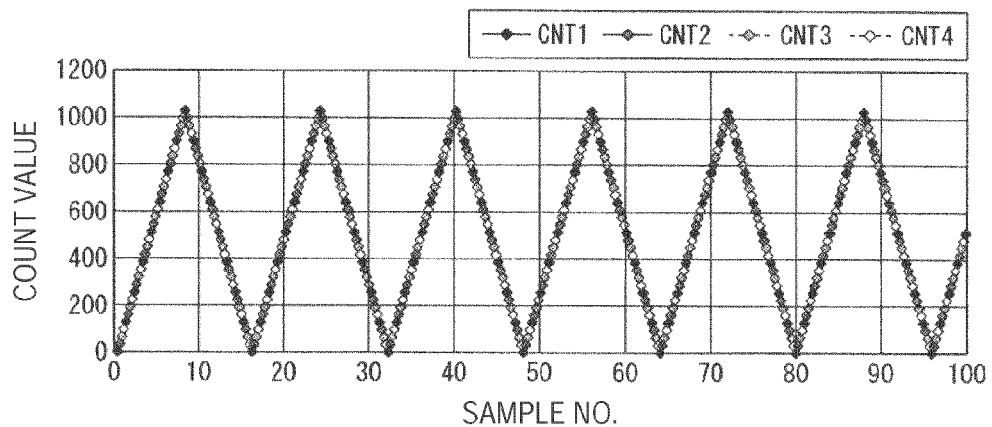
FIGS. 14A to 14C are illustrations of an operation of the pulse width modulation circuit of FIG. 10.
Figure 14B:
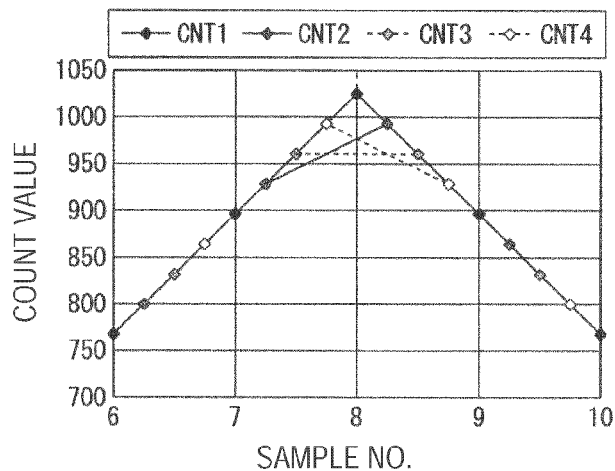
Figure 14C:
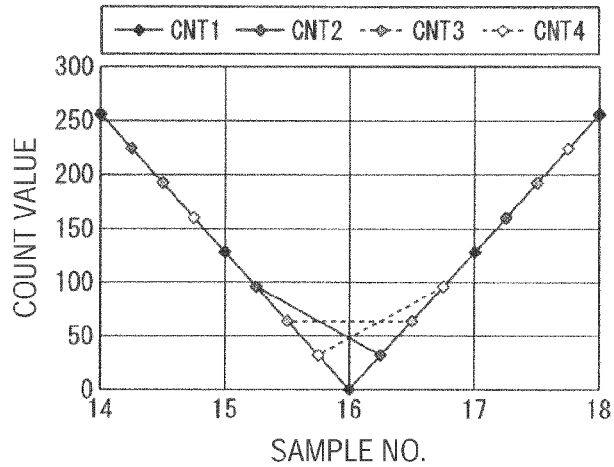

Triangle wave signals are represented in a quasi-form, in FIG. 14A, by overlapping these count values of the reference signals CNT1 to CNT4. FIG. 14B shows the vicinity of the maximum value of the triangle wave signal appearing at sample No. 8, and FIG. 14C shows the vicinity of the minimum value of the triangle wave signal appearing at sample No. 16. With the examples shown in FIGS. 14A to 14C, as the amplitude of the triangle wave signals is 1024, it is possible to meet a level of the input signal IN for up to a maximum of ten bits. The triangle wave signals of FIGS. 14A to 14C in the form in which the count values are overlapped are not actually of the reference signals used for comparing with the input signal, but are of a quasi-form, and actual reference signals used for comparing with the input signal are only the individual reference signals CNT1 to CNT4, but by setting the increase or decrease values DEF, decrease start initial values UTOD, and increase start initial values DTOU as in Table 1, it is possible to obtain a high precision triangle wave signal, and it is thereby possible to obtain a more accurate pulse width modulated signal.

In this way, according to the pulse width modulation circuits of the first to third embodiments, a configuration is such as to, from the plurality of clock signals CLK1 to CLK4 with mutually differing phases, generate the plurality of reference signals CNT1 to CNT4 which increase (or decrease) for each of the clock signals CLK1 to CLK4, output results, obtained by comparing the reference signals CNT1 to CNT4 and the input signal IN with respect to magnitude, as the comparison signals PWM1 to PWM4, and output the output plurality of comparison signals PWM1 to PWM4 as a pulse width modulated signal PWM configured of one binary signal derived from the logical operation. Therefore, as the output pulse width modulated signal PWM is a binary signal, one resistor or one switching element will suffice. Because of this, it is possible to suppress a circuit size, and also, the reference signals CNT1 to CNT4, generated from the plurality of clock signals CLK1 to CLK4 with differing phases, and the input signal IN are compared with respect to magnitude, and one binary signal is output as the pulse width modulated signal PWM from a logical operation of the comparison signals PWM1 to PWM4, thereby enabling an increase in resolution in a temporal axis direction.

Also, by increasing the number of clock signals (the number of phases) which are the source of the reference signals, the resolution of the pulse width modulated signal PWM is increased with the frequency of the reference signals CNT1 to CNT4 maintained in a high condition, meaning that the high speed response is possible. As it is nevertheless not necessary to heighten the frequency of the clock signals CLK1 to CLK4, it is possible to bring about a stable operation with a simple circuit.

Also, the plurality of counters 32a to 32d and 49 which increase or decrease for each clock signal CLK1 to CLK4, and have differing increase start or decrease start initial values Offset, DTOU, or UTOD, are provided so as to correspond to the plurality of clock signals CLK1 to CLK4 with differing phases, and the outputs from the counters 32a to 32d and 49 are taken to be the plurality of reference signals CNT1 to CNT4, thereby enabling the increase in resolution in the temporal axis direction. Also, by increasing the number of clock signals (the number of phases) which are the source of the reference signals, the resolution of the pulse width modulated signal PWM is increased with the frequency of the reference signals CNT1 to CNT4 maintained in a high condition, meaning that the high speed response is also possible. As it is nevertheless not necessary to heighten the frequency of the clock signals CLK1 to CLK4, it is possible to bring about a stable operation with a simple circuit.

Also, by providing the counter 351, which increases (or decreases) for each clock signal CLK1 to CLK4, so as to correspond to the first clock signal CLK1 from among the plurality of clock signals CLK1 to CLK4 with differing phases, and providing the adders and comparators (addition and subtraction sections) 36a to 36d, which generate the plurality of reference signals CNT1 to CNT4 by adding (or subtracting) the output from the counter 351 to (or from) the mutually differing increase start (or decrease start) initial values offset1 to offset4 for each of the plurality of clock signals CLK1 to CLK4 with differing phases, it being possible to further reduce the number of counters in addition to the heretofore described advantages, it is possible to suppress the circuit size.

Also, by the up/down counter 49 switching between the increase and decrease in the predetermined cycle, it is possible to obtain the triangle wave signals as the reference signals CNT1 to CNT4, whereby, in addition to the heretofore described advantages, it is possible to further suppress an output distortion of the pulse width modulated signal.

Also, as well as outputting the logical sum of the plurality of comparison signals PWM1 to PWM4, by outputting the logical product of the plurality of comparison signals PWM1 to PWM4, selecting either the logical sum or logical product, and outputting it as the pulse width modulated signal PWM, as well as it being possible to output a pulse width modulated signal with a high resolution in the temporal axis direction, it is possible to adjust the duty ratio of the pulse width modulated signal PWM as necessary.

Also, by selecting one of the logical sum and logical product when the up/down counter 49 increases, and selecting the other when the up/down counter 49 decreases, in the kind of case in which the waveform of the reference signals CNT1 to CNT4 is a triangle wave, a synthesis is carried out in such a way that a comparison error included in a comparison result when the reference signals CNT1 to CNT4 increase, and a comparison error included in a comparison result when they decrease, are cancelled out, meaning that it is possible to output a high-resolution and high-precision pulse width modulated signal.

Also, by providing a mask in such a way that the pulse width modulated signal PWM does not change when the counter 351 is reset, it is possible to stabilize the pulse width modulated signal PWM when the counter 351 is reset, and it is thereby possible to ensure the resolution of the pulse width modulated signal PWM.

In the first to third embodiments, a description has been given of the case in which the phases of the clock signals CLK1 to CLK4 are shifted 90 degrees each, but the number of clock signals is not limited to this. Also, it is taken that a counter increase or decrease unit d is an integral multiple of a number N of clock signals with mutually differing phases, and in the event that the phase difference of an ith clock signal CLKi with respect to the clock signal CLK1 with the earliest phase is pi degree, by taking an increase start or decrease start initial value offseti corresponding to the ith clock signal CLKi to be offseti=dxpi/360+a, where a is a constant, it is possible to respond to any phase difference. Incidentally, the constant a is for driftingly shifting a value of the counter, that is, the whole of a reference signal CNTi.

Also, in the first to third embodiments, the clock signal generation circuit is taken to be one portion of the configuration but, in the event that a plurality of clock signals with mutually differing phases are available from the exterior, the clock signal generation circuit is not included in the configuration requirement.

Also, in the first to third embodiments, a detailed description has been given only of the case in which the pulse width modulation circuit of some aspects of the invention is used in a line head type of liquid jet printing apparatus, but the pulse width modulation circuit of some aspects of the invention is also similarly applicable to a multipath type of liquid jet printing apparatus.

Also, the liquid jet printing apparatus using the pulse width modulation circuit of some aspects of the invention can also be embodied into a liquid jetting apparatus which jets a liquid other than ink (also including, apart from the liquid, a liquid state substance in which functional material particles are dispersed, or a fluid state substance such as gel) or a fluid other than the liquid (a solid which can be jetted streamed as a fluid, or the like). It is also acceptable that it is a liquid state substance jetting apparatus which jets a liquid state substance including a material, such as an electrode material or color material used in a manufacture or the like of a liquid crystal display, electroluminescence (EL) display, surface emitting display, or color filter, in a dispersed or dissolved form, a liquid jetting apparatus which jets a bioorganic substance used in manufacturing biochips, or a liquid jetting apparatus which jets a liquid which acts as a specimen by being used as a precision pipette.

Furthermore, it is also acceptable that it is a liquid jetting apparatus which jets a lubricant onto a precision instrument such as a watch or camera with a pinpoint precision, a liquid jetting apparatus which jets onto a substrate a transparent resin liquid such as an ultraviolet curing resin for forming a micro hemispherical lens (optical lens) or the like used in an optical communication element or the like, a liquid jetting apparatus which jets an etching liquid such as an acid or alkali in order to etch a substrate or the like, a fluid state substance jetting apparatus which jets gel, or a fluid jet recording apparatus which jets a solid exemplified by a powder such as toner. Then, the invention can be applied to one kind of jetting apparatus from among these.

Furthermore, the pulse width modulation circuit of some aspects of the invention, not being limited to the jetting apparatus, can be applied to any application utilizing a pulse width modulation, such as an interface of communication or the like, or a motor drive, and can be effectively utilized as various kinds of drive circuit.

What is claimed is:

1. A pulse width modulation circuit comprising:
   a reference signal generator which generates a plurality of mutually differing reference signals;
   a comparator which compares the reference signals and an input signal with respect to magnitude, and outputs results of the comparison as a plurality of comparison signals with mutually differing phases; and
   a synthesizer which, using a logical operation, outputs the plurality of comparison signals output from the comparator as a pulse width modulated signal configured of one or more binary signals.

2. The pulse width modulation circuit according to claim 1, wherein
   the reference signal generator includes a plurality of counters, which increase or decrease for each clock signal, and whose increase start or decrease start initial values differ from one another, so as to correspond to a plurality of the clock signals with mutually differing phases, and outputs from the counters are taken to be the plurality of reference signals.

3. The pulse width modulation circuit according to claim 2, wherein the counter switches between the increase and decrease in a predetermined cycle.

4. The pulse width modulation circuit according to claim 2, wherein
   in the event that a unit d of the increase or decrease of the counter is an integral multiple of a number N of the clock signals with mutually differing phases, and a phase difference of an ith clock signal CLKi with respect to a clock signal CLK1 with an earliest phase is pi degree, an increase start or decrease start initial value offseti corresponding to the ith clock signal CLKi establishes offseti=dxpi/360+a, where a is a constant, d is a d is an integral multiple of a number N of clock signals with mutually differing phases and the start initial value offseti corresponds to the ith clock signal CLKi.

5. The pulse width modulation circuit according to claim 2 wherein
   the synthesizer includes a mask section which provides a mask in such a way that the pulse width modulated signal does not change when the counter is reset.

6. The pulse width modulation circuit according to claim 1, wherein
   the reference signal generation circuit includes a counter, which increases or decreases for each clock signal, so as to correspond to at least one clock signal, from among a plurality of the clock signals with mutually differing phases, and an addition and subtraction section, which generates the plurality of reference signals by adding or subtracting a plurality of offset values having mutually differing values correlated to the plurality of clock signals with differing phases to or from an output from the counter, and
   the comparator is configured in such a way as to compare the reference signals and the input signal with respect to magnitude, and output the comparison results in synchronization with the corresponding clock signals.

7. The pulse width modulation circuit according to claim 1, wherein
   the synthesizer includes an OR section which outputs a logical sum of the plurality of comparison signals, an AND section which outputs a logical product of the plurality of comparison signals, and a selection section which selects either the logical sum from the OR section or the logical product from the AND section, and outputs it as a pulse width modulated signal.

8. The pulse width modulation circuit according to claim 7, wherein
   the reference signal generator includes a plurality of counters, which increase or decrease for each clock signal, and whose increase start or decrease start initial values differ from one another, so as to correspond to a plurality of the clock signals with mutually differing phases, and outputs from the counters are taken to be the plurality of reference signals, and
   the selection section selects one of the logical sum from the OR section and the logical product from the AND section when the counter increases, and selects the other when the counter decreases, or is reset.

9. A liquid jet printing apparatus using the pulse width modulation circuit according to claim 1.

* * * * *